(12) United States Patent  (10) Patent No.: US 7,879,680 B2
Sasaki et al.  (45) Date of Patent: Feb. 1, 2011

(54) METHOD OF FABRICATING SEMICONDUCTOR DEVICE

(75) Inventors: Hiromi Sasaki, Kanagawa (JP); Masashige Moritoki, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 127 days.

(21) Appl. No.: 12/232,885

(22) Filed: Sep. 25, 2008

(65) Prior Publication Data

US 2009/0087957 A1 Apr. 2, 2009

(30) Foreign Application Priority Data

Sep. 28, 2007 (JP) ............... 2007-253154

(51) Int. Cl.
*H01L 21/02* (2006.01)
(52) U.S. Cl. ............... 438/386; 438/396; 438/785; 257/E21.008
(58) Field of Classification Search ......... 438/702, 438/386, 394
See application file for complete search history.

(56) References Cited

U.S. PATENT DOCUMENTS

| 6,518,142 | B2 | 2/2003 | Yamamoto |
| 2001/0023109 | A1 | 9/2001 | Yamamoto |
| 2002/0190294 | A1 | 12/2002 | Iizuka et al. |
| 2005/0285268 | A1* | 12/2005 | Hsu et al. ............ 257/758 |
| 2006/0234511 | A1 | 10/2006 | Ohuchi |

FOREIGN PATENT DOCUMENTS

| JP | 2001-210787 | 8/2001 |
| JP | 2002-373945 | 12/2002 |
| JP | 2006-303063 | 11/2006 |

* cited by examiner

*Primary Examiner*—Fernando L Toledo
*Assistant Examiner*—Mamadou Diallo
(74) *Attorney, Agent, or Firm*—McGinn IP Law Group, PLLC

(57) ABSTRACT

Photoresist on a metal is removed with less oxidation of the metal surface by the invented ashing. During process, the matching of oxygen gas ratio and wafer temperature under downstream plasma which means no RF bias plasma is controlled for oxidation amount not to depend on ashing time with required photo resist rate in manufacturing.

20 Claims, 11 Drawing Sheets

140 DRAM PART

119

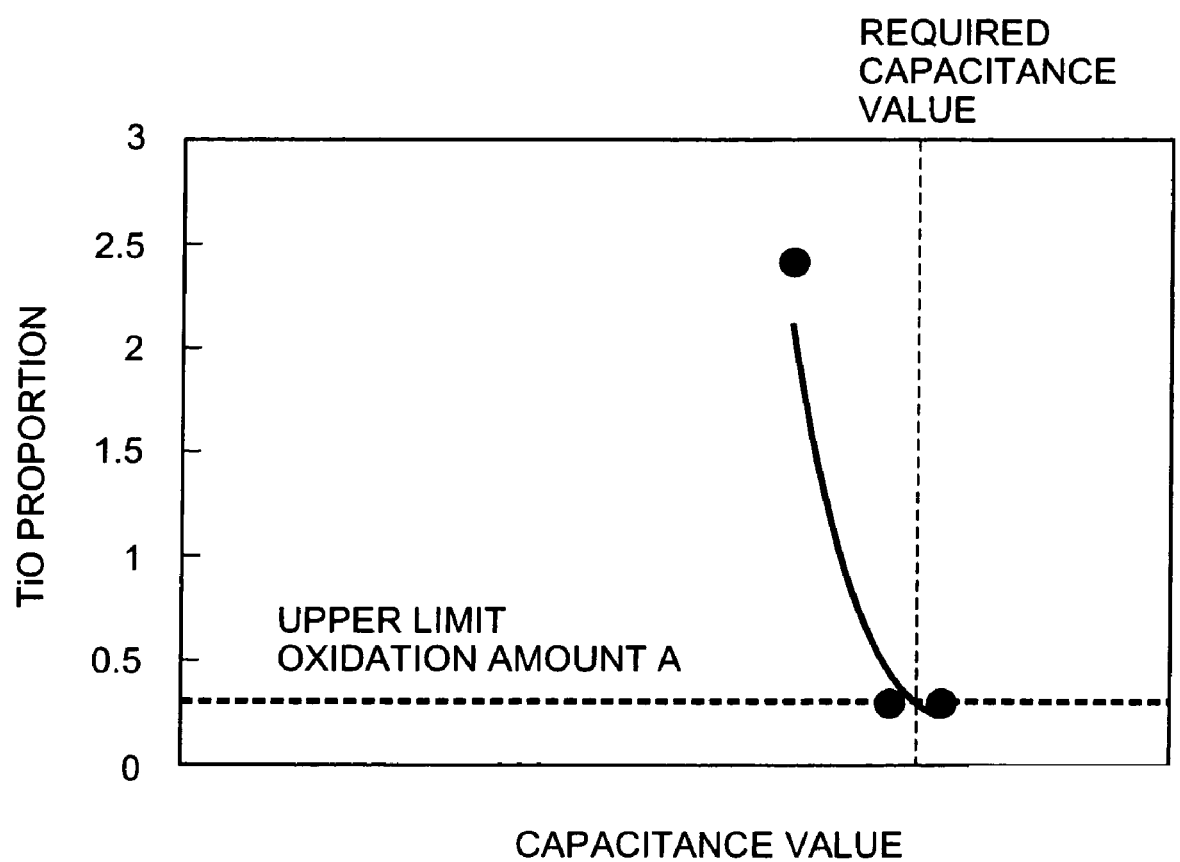

METHOD OF FABRICATING SEMICONDUCTOR DEVICE

This application is based on Japanese Patent Application No. 2007-253154.

BACKGROUND OF THE INVENTION

1. Field of the Invention

This invention relates to a method of fabricating semiconductor devices and, more specifically, to a method of fabricating MIM (Metal-Insulator-Metal) capacitors.

2. Description of the Related Art

It is required that a large capacitance capacitor is formed in a narrow space accompanying with the scaling down of the semiconductor device, especially for DRAM. MIM (Metal-insulator-metal) capacitor structure having top and lower electrodes made of metal has been developed for increasing capacitance. Japanese Patent Application Laid-Open No. 2006-303063 and Japanese Patent Application Laid-Open No. 2001-210787 disclose technology to process a lower electrode of such an MIM capacitor with a photoresist to control the interface where a metal lower electrode film contacts a dielectric film. Japanese Patent Application Laid-Open No. 2002-373945 discloses to integrate an MIM capacitor on an embedded DRAM (Logic mixed DRAM).

Oxidation of the metal lower electrode still gives rise to a problem during process of the lower electrode in an attempt to enhance capacitance while further scaling down semiconductor devices. Most of metal oxides have an insulating property. Therefore, formation of oxide film on the electrode surface thickens the capacitor film substantially so as to decrease capacitance. However, the present inventors get aware of following prior art problems. Removal of photoresist takes place with gas containing oxygen as described in Japanese Patent Application Laid-Open No. 2001-210787 so that oxygen oxidizes the lower electrode. An ashing method for protecting oxidation of a lower electrode is considered to fulfill ashing conditions for lowering the ashing temperature and halting oxidation. In such a case, the ashing rate drops. In order to compensate for the decrease in ashing rate, extension of time for the portion of the decrease of ashing rate is time consuming and cannot sufficiently prevent the lower electrode from being oxidized. In contrast, an attempt to attain high ashing rate (ashing rate for actual use) without using oxygen as in Japanese Patent Application Laid-Open No. 2006-303063 requires fulfillment of high bias conditions which damages devices.

SUMMARY

The present application includes the steps of: forming a first metal film on a substrate; forming a photoresist film on the first metal film; forming a pattern in the photoresist film; processing the first metal film by a dry etch with the pattern as a mask; ashing the photoresist without any bias at a predetermined temperature on the first metal film processed during the step of the dry etching process; forming a dielectric film on the first metal film subjected to ashing of the photoresist; and forming a second metal film on the dielectric film to form an MIM capacitor, wherein percentage of oxygen gas for carrying out the ashing step is not more than percentage of oxygen where oxidation amount of the first metal layer does not depend on ashing time and is set to not less than percentage of oxygen where the ashing rate is 200 nm/min or faster. In the case where the first metal film is titanium nitride, the percentage of oxygen is not less than 50% and not more than 80% at 25° C. and not less than 25% and not more than 50% at 40° C.

BRIEF DESCRIPTION OF THE DRAWINGS

The above and other objects, advantages and features of the following description taken in conjunction with the accompanying drawings, in which:

FIG. 8 is a graph illustrating relation between the capacitance value and the lower electrode oxidation amount;

DETAILED DESCRIPTION OF PREFERRED EMBODIMENTS

Figure 1:
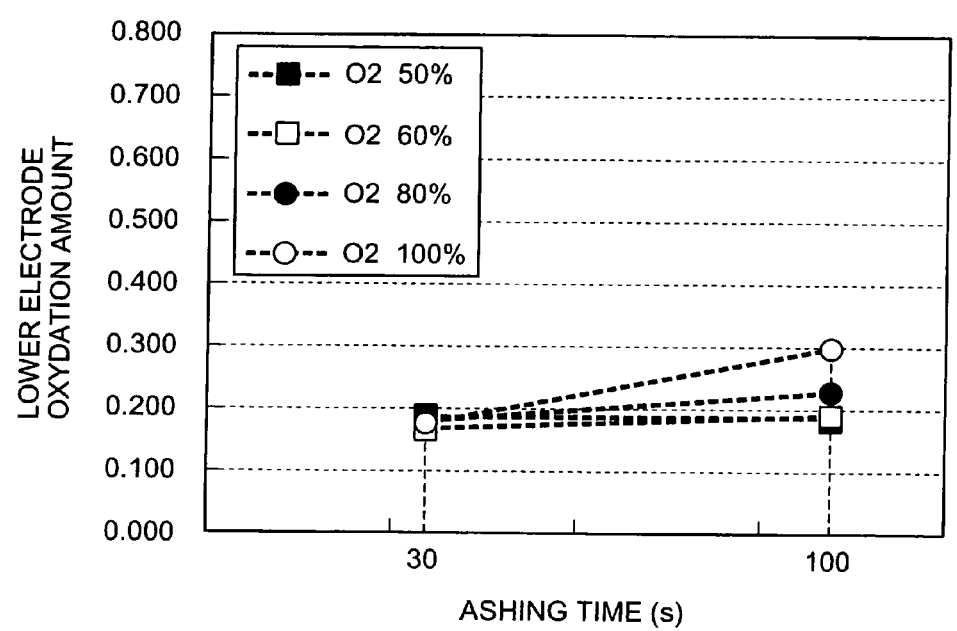
FIG. 1 is a graph illustrating oxygen percentage dependency of the lower electrode oxidation amount on ashing time.

Embodiments of the present invention will be described below with drawings. Here, throughout the drawings, where like components are designated by like reference numerals in order to omit repetitive description. Those skilled in the art will recognize that many alternative embodiments can be accomplished using the teachings of the present invention and that the invention is not limited to the embodiments illustrated for explanatory purposes.

At first, summary on solving the problems in the present application will be described. As a result of intensified study, the present inventors have obtained knowledge illustrated in FIG. 1. FIG. 1 is obtained by plotting relation between ashing time and an oxidation amount to be described below of a metal lower electrode to be processed at a process temperature of 25° C. subjected to changing the oxygen percentage. This experiment newly shows that increase of the oxidation amount in metal does not depend on ashing time against normal expectation in the case of a certain oxygen percentage or less when the oxygen percentage decreases. Thus the region where the oxygen amount does not depend on ashing time apparently enables photoresist removal by securing ashing rate at oxygen percentage to oxidize no metal without causing any fabrication problem.

Embodiment 1

Figure 2:
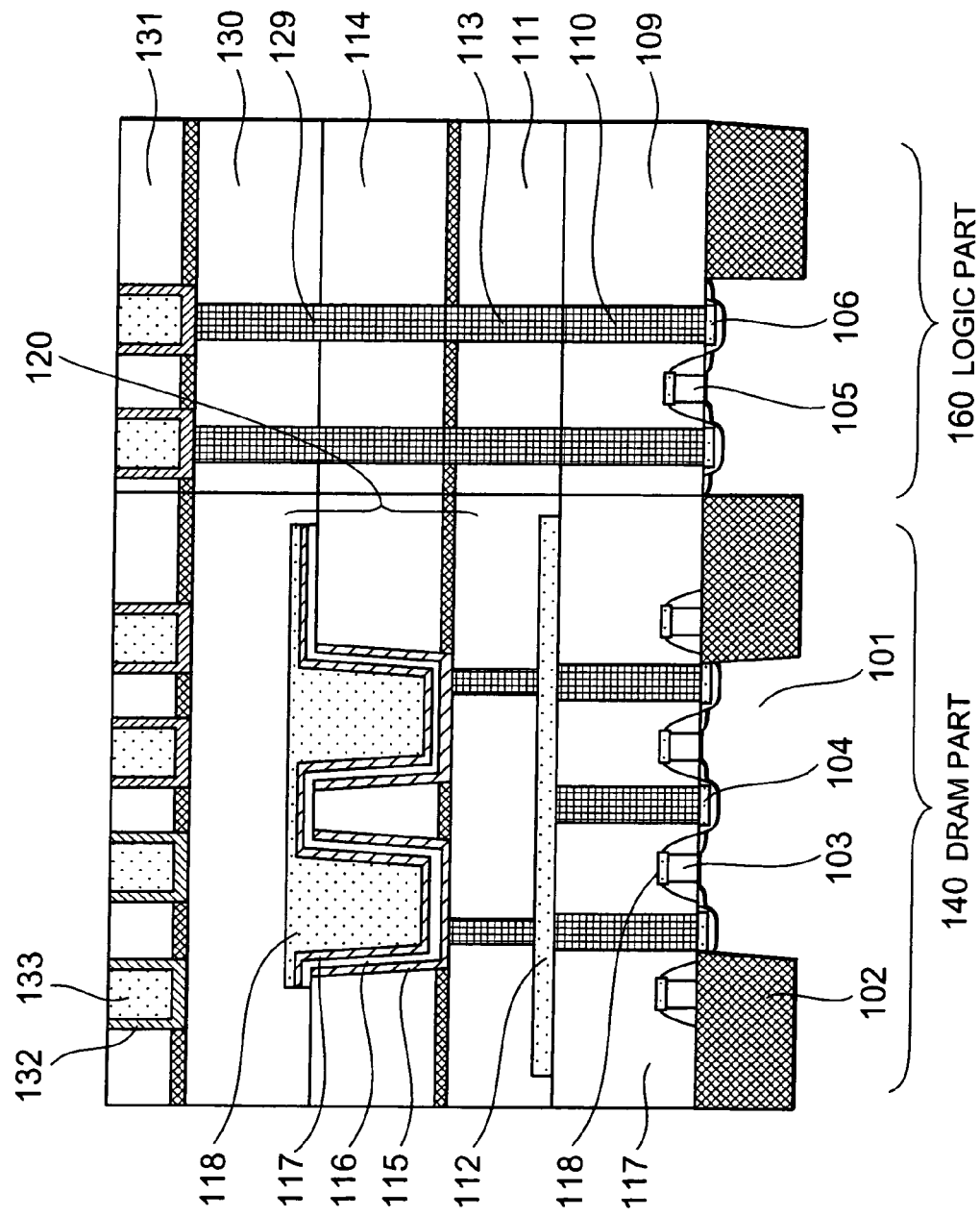
FIG. 2 exemplifies a semiconductor device.

FIG. 2 is a cross-sectional view of an embedded DRAM (Logic mixed DRAM) being an example of a semiconductor device formed on a substrate by applying the method of producing an MIM capacitor of the present invention. The fabrication method of the present invention relates to the MIM capacitor and, therefore, will not be limited to the embedded DRAM but is applicable, for example, to general-purpose DRAMs.

The semiconductor device in FIG. 2 comprises of a DRAM part 140 and a Logic part 160 and has an MIM capacitor 120 comprising of a first metal film 115 being a lower electrode, a capacitor dielectric 116, second metal films 117 and 118 being upper electrodes. The second metal film can be a stacked film made of the metal films 117 and 118 and can be a single layer film of those films. This MIM capacitor 120 is connected to a silicide layer 104 formed in a diffusion layer of the transistor 103 of the DRAM part, metal plugs 110 and 113 and the lower electrode 115. In FIG. 2, a wiring layer 131 is present only in the upper layer of the MIM capacitor 120. But the wiring layer can be in the lower layer of the MIM capacitor 120. In this drawing, the MIM capacitor is cylindrically structured but can be a planar type or a stacked type.

Figure 3:
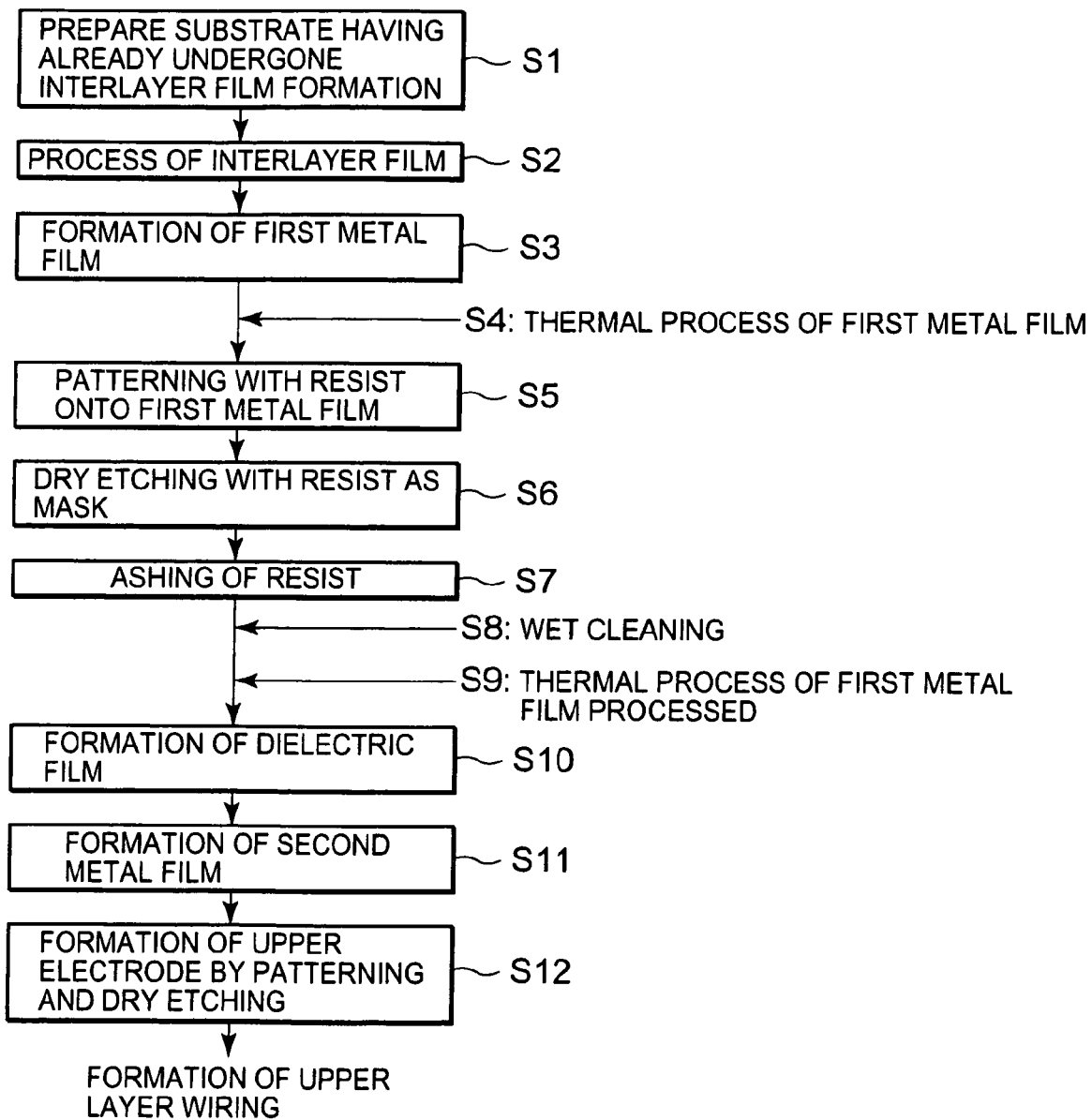
FIG. 3 is a flow chart on capacitor production.
Figure 4:
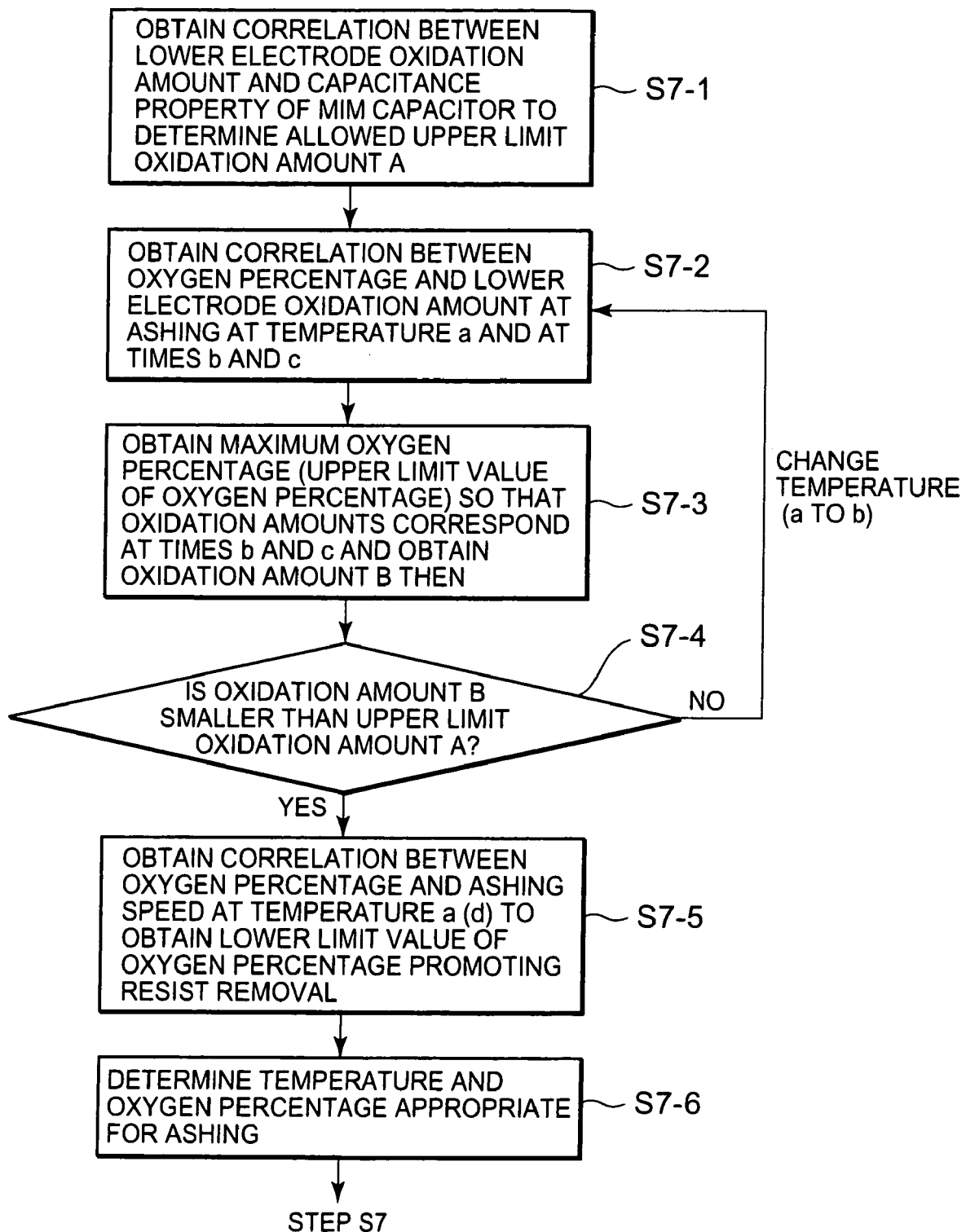
FIG. 4 is a flow chart for determining ashing conditions.
Figure 5A:
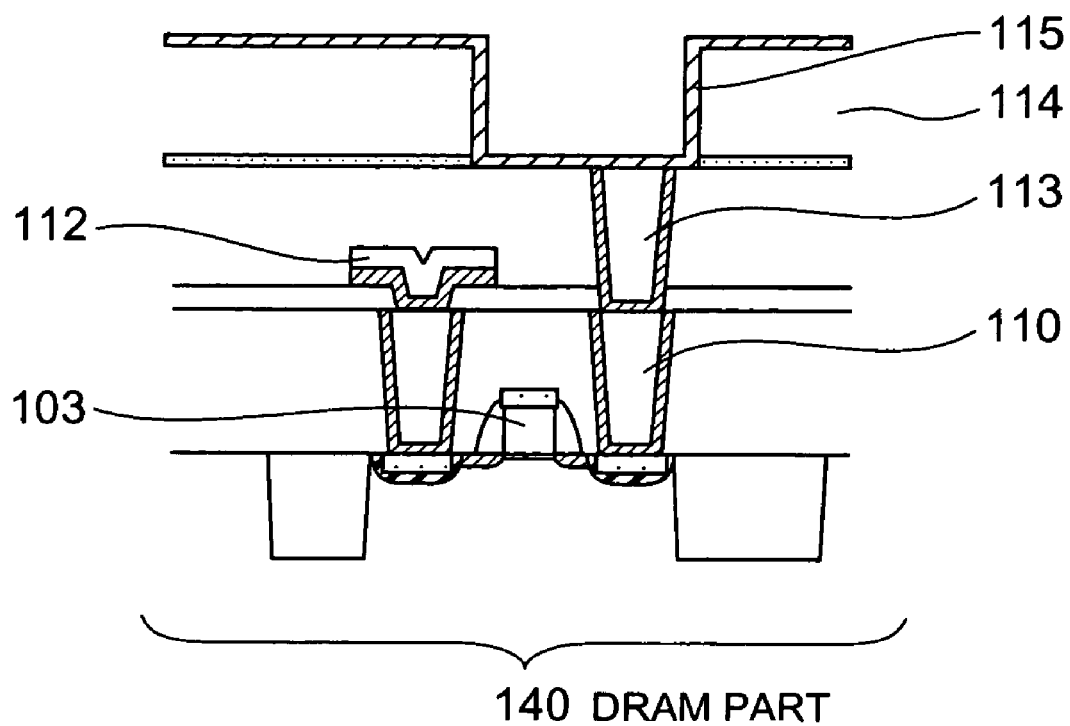
FIG. 5A and FIG. 5B are cross-sectional views of a step of manufacturing an MIM capacitor.
Figure 5B:
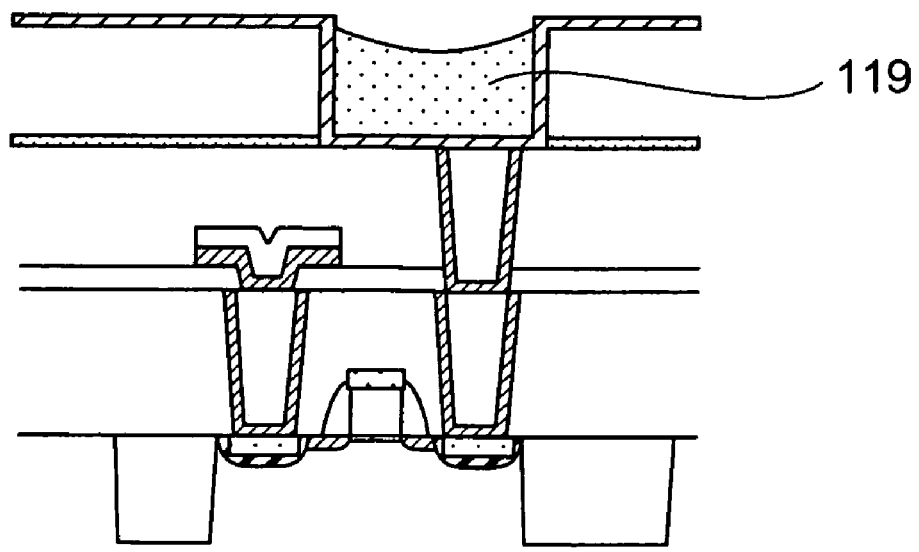
Figure 6A:
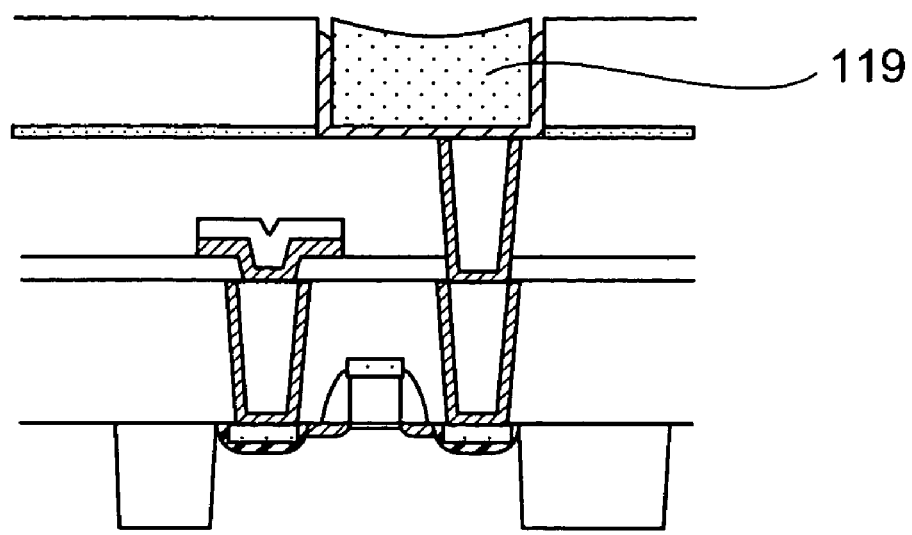
FIG. 6A and FIG. 6B are cross-sectional views of a step of manufacturing an MIM capacitor.
Figure 6B:
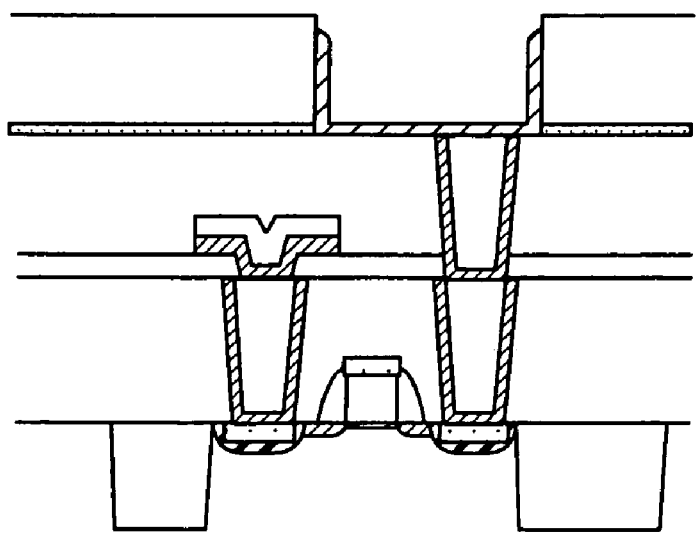
Figure 7A:
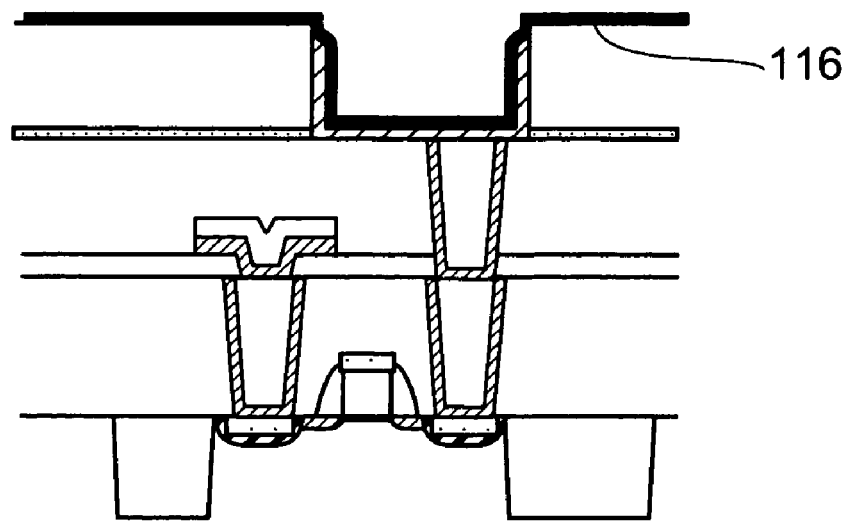
FIG. 7A and FIG. 7B are cross-sectional views of a step of manufacturing an MIM capacitor.
Figure 7B:
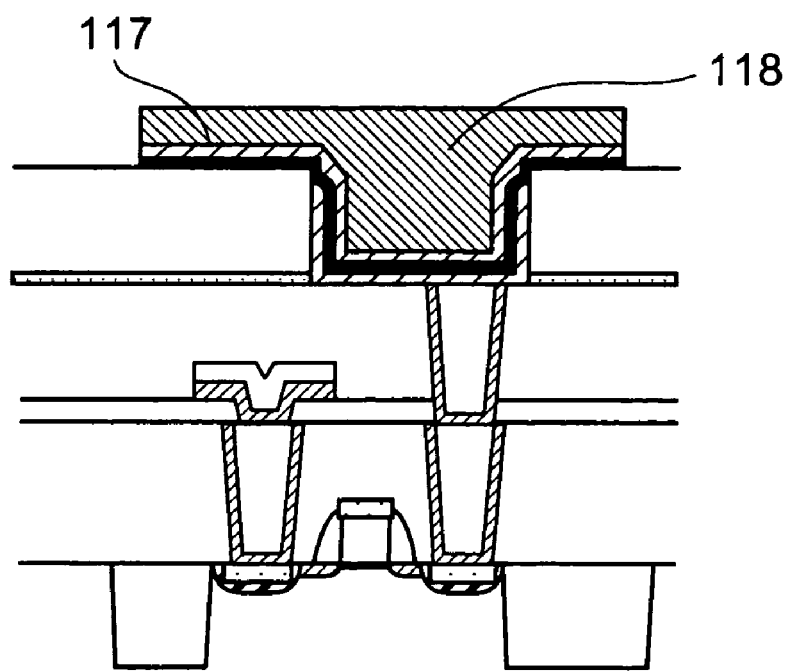

FIG. 3 is a flow chart encompassing steps to be described with FIG. 5, FIG. 6 and FIG. 7. FIG. 4 is a flow chart for determining conditions on S7 ashing based on graphs in FIG. 8, FIG. 9 and FIG. 10.

FIG. 5, FIG. 6 and FIG. 7 are cross-sectional views to describe a flow of the fabrication step of the MIM capacitor 120, in particular, of the DRAM part 140 in FIG. 2. After forming a transistor 103, a bitline 112 and metal plugs 110 and 113, an interlayer film 114 is formed (step S1). The site connected to the metal plugs in this interlayer film 114 undergoes dry etching to carry out a process of forming a cylinder (step S2). After this process, a first metal film to become a lower electrode 115 is formed (step S3). Titanium nitride, for example, is used for this first metal film. A technique for forming a film includes techniques such as sputtering, CVD (Chemical Vapor Deposition) and ALD (Atomic Layer Deposition) and is preferably a technique enabling film forming at a low temperature (not higher than 500° C.) so as not to influence the transistor property during formation of the entire semiconductor device subjected to reduction of impurity. MOCVD (Metal Organic Chemical Vapor Deposition) with an organic metal material is preferable for the case of CVD. A thermal process can follow the formation of the metal film of the lower electrode 115 (step S4). The thermal process enables formation of a fine film being resistant against oxidation of the subsequent steps. This thermal process is desired to take place without plasma. In this case, isotropical heating densificates the wall surface on the cylinder side as well. The thermal process takes place, for example, in a nitrogen atmosphere.

Photoresist of around 1000 nm is applied to the entire surface of the substrate. Only the interior of the cylinder undergoes a process of leaving photoresist 119 to become a mask for dry etching (step S5) (FIG. 5B). Subsequently, dry etching is carried out to remove the lower electrode film in the portion not covered by the photoresist 119. In that case, the lower electrode occasionally made of titanium nitride undergoes etching with gas containing, for example, chlorine, nitrogen and argon (step S6). The photoresist 119 remains after dry etching (FIG. 6C). In the case where wafer process apparatus is open to the atmosphere before ashing, for example, when movement from an etching apparatus to an ashing apparatus occurs without in-situ photoresist removal, heating between 100 to 300° C. in an inert gas atmosphere inside an etching apparatus is preferable for the subsequent removal of photoresist. Removal of the photoresist 119 follows etching (step S7). Those conditions will be described later.

An insulator film 116 is formed on the lower electrode 115 subjected to removal of the photoresist (step S10). The insulator film 116 can be selected from $ZrO_2$, $HfO_2$, $Al_2O_3$ and $TiO_2$. However, $ZrO_2$ is the most preferable. A method for forming this $ZrO_2$ includes techniques such as sputtering, CVD and ALD and is preferably a technique enabling film forming at a low temperature (not higher than 500° C.) so as not to influence the transistor property during formation of the entire semiconductor device subjected to reduction of impurity.

After forming the insulator film 116, upper electrodes 117 and 118 being second metal films are formed (step S11). The second metal film can be a stacked film made of the metal films 117 and 118 and can be a single layer film of those films. Titanium nitride, for example, is used for this metal film 117. A technique for this film forming includes techniques such as sputtering, CVD and ALD and is preferably a technique enabling film forming at a low temperature (not higher than 500° C.) so as not to influence the transistor property during formation of the entire semiconductor device subjected to reduction of impurity. MOCVD with an organic metal material is preferable for the case of CVD. Tungsten is used for the metal film 118. After forming those films, patterning with photoresist form so as to carry out dry etching to form the upper electrode (step S12).

A method of setting ashing removal conditions after etching will be described with reference to FIG. 4. As the ashing hereafter, an ashing apparatus carries out plasma ashing without any bias with ashing gas containing oxygen and inert diluent gas. The diluent gas is selected from the group of nitrogen and argon, nitrogen is more preferable. For description on the ashing condition setting method hereafter, nitrogen will be used as the diluent gas. Therefore, percentage of oxygen for nitrogen will be oxygen percentage.

At first, an upper limit oxidation amount A allowed at the time of ashing is obtained (S7-1). FIG. 8 is obtained by plotting TiO proportions and capacitance values being lower electrode oxidation amounts at a TiO proportion value. The capacitance value in FIG. 8 is measured by forming the MIM capacitance, as in FIG. 5, FIG. 6 and FIG. 7. The TiO proportion is determined by XPS or SIMS measurement with samples prepared under corresponding ashing conditions. The TiO proportion is the proportion of the $TiO_x$ amounts of samples having undergone processing under prior art conditions (or a basic condition) as ashing conditions and samples having undergone various ashing conditions subjected to XPS (X-ray Photoelectron Spectroscopy) or SIMS (Secondary Ion Mass Spectroscopy) measurement to determine quantity of $TiO_x$. As samples for XPS and SIMS, samples for lower electrode oxidation amount measurement are prepared by forming oxide film on a substrate, thereafter, forming TiN thereon and carrying out an actual ashing process thereon. Subjected to those measurements, a TiO proportion satisfying the target capacitance is obtained based on the curve obtained by plotting the capacitance values and TiO proportions. This TiO proportion will become the upper limit oxidation amount A. This value varies based on the shape of the lower electrode of the capacitor and the capacitance value to be required but is, for example, around 0.4.

Figure 9:
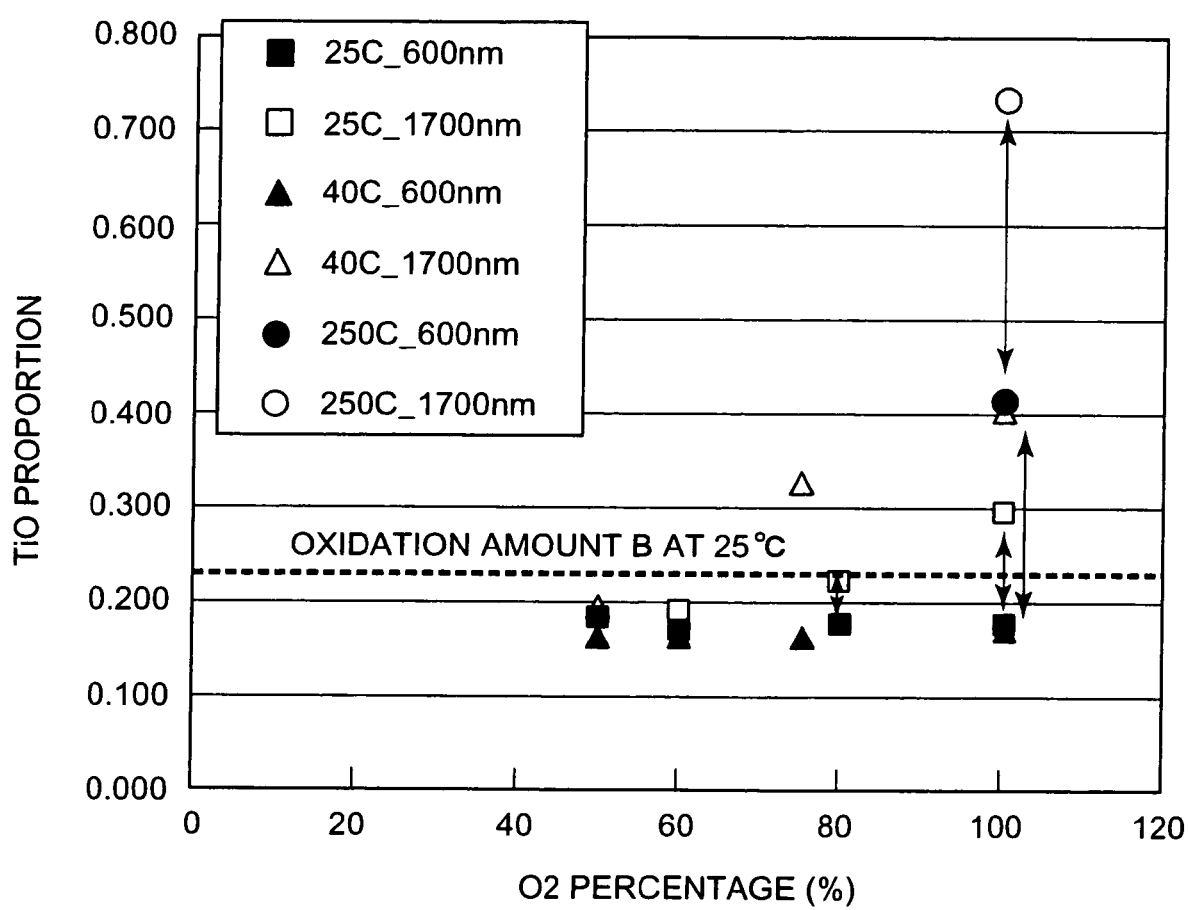
FIG. 9 is a graph illustrating relation between oxygen percentage and the lower electrode oxygen amount.
Figure 10:
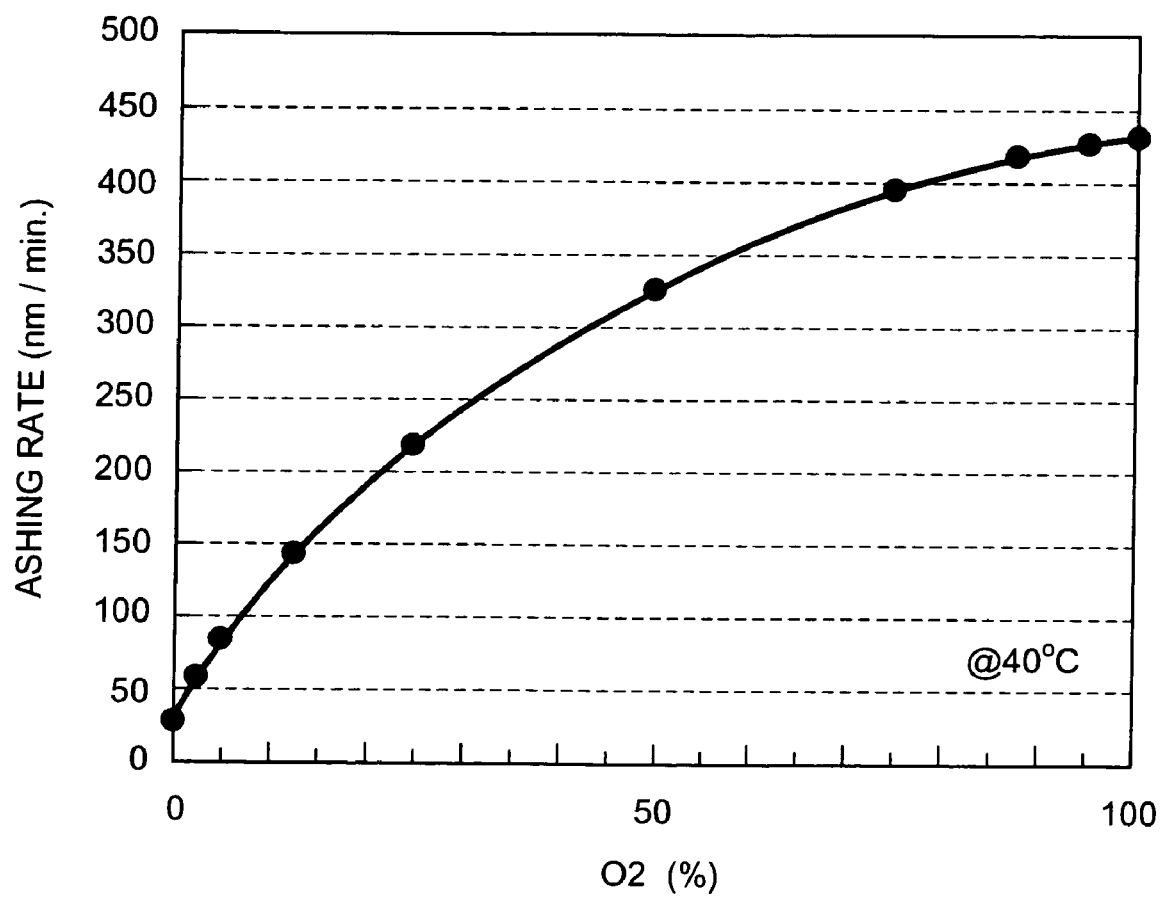
FIG. 10 is a graph illustrating relation between oxygen percentage and ashing rate.

Subsequently, FIG. 9 plots correlation between the percentage of oxygen for nitrogen and the oxidation amount at a certain temperature a with photoresist amounts b and c (step S7-2). The TiO proportion is obtained by preparing samples by a method as described above and with XPS and SIMS. FIG. 9 illustrates TiO proportion in the case where the percentage of oxygen for nitrogen varies at the temperature is 25° C., 40° C. and 250° C. with the photoresist amount of 600 nm and 1700 nm. Thicker photoresist film proportionally increases process time. Therefore, the level of photoresist thickness corresponds to length of ashing time. At 25° C., there is a slight difference in TiO proportion depending on their photoresist thicknesses at the percentage of oxygen for nitrogen being 80%. Therefore, 80% is the upper limit of percentage of oxygen for nitrogen at 25° C. Thus the TiO proportion (oxidation amount B) at 25° C. is around 0.25 (S7-3). Percentage of oxygen for nitrogen giving rise to difference in the lower electrode oxidation amount due to ashing time depends on temperature for the ashing process and the kind of metal used for the lower electrode. Therefore, the percentage of oxygen for nitrogen and the photoresist amount for the ashing process is caused to vary on each process temperature and each metal. Thereby, obtaining the correlation, the percentage of oxygen for nitrogen eliminating time dependency is obtained. Based on FIG. 9, the upper limit percentage of oxygen for nitrogen is 80% at 25° C. and 50% at 40° C. Here, at the ashing temperature of lower than 25° C. and for oxygen percentage with too much drop of the occurrence of time dependency at the temperature higher than 40° C. on the contrary, the ashing rate gets slow. Therefore, the temperature for ashing is preferably not lower than 25° C. and not higher than 40° C.

Next, the upper limit oxidation amount A obtained in the step S7-1 is compared with the oxidation amount B obtained in the step S7-3 (step S7-4). In the example hereof, the oxidation amount B is smaller than the upper limit oxidation amount A. Therefore, the step S7-5 is carried out. In the case where the oxidation amount B is larger than the oxidation amount A, the ashing temperature is required to drop so as to decrease the oxidation amount.

Since the step S7-3 determines the ashing temperature, the step S7-5 obtains correlation between the percentage of oxygen for nitrogen at the determined temperature and the ashing rate. The ashing rate is obtained by confirming thickness of residual photoresist film through cross-sectional SEM (Secondary Electron Microscopy) after the ashing process for a certain period. The lower limit value of the percentage of oxygen for nitrogen is determined based on the ashing rate which will not be influenced by removal of photoresist for fabrication. The ashing rate is preferably not less than 200 nm/min. The percentage of oxygen for nitrogen will be not less than 50% at 25° C. and will be not less than 25% at 40° C. However, since the ashing rate decreases as the percentage of oxygen for nitrogen gets less, it is desirable to use the condition with a high percentage of oxygen for nitrogen. Therefore, the percentage of oxygen for nitrogen for the oxidation amount B in the step S7-3 will be the most preferable from the point of view of the ashing rate and prevention of oxidation of the lower electrode. For example, the percentage of oxygen for nitrogen is 80% at 25° C. and 50% at 40° C. The temperature appropriate for ashing and the range of percentage of oxygen for nitrogen are determined by the foregoing flow.

After ashing the photoresist as described above, wet cleaning (S8) can be carried out with one or more kinds of cleaning solution selected from the group of dimethylsulfoxide, amine and ammonium fluoride. Use of cleaning solution which possesses the reduction characteristic such as choline, reduced developer, reduction water or their mixture can improve the capacitance of the memory cell (Cs). It is possible to decrease the TiO proportion by using above cleaning solution.

In the above-mentioned explanation, the material of the lower metal electrode is made of titanium nitride. This technique is also applicable for the other metal having tendency oxidized easily which is selected from the group of tungsten nitride, titanium, tungsten, ruthenium and platinum that can be oxidized by oxygen. The TiO proportion being the lower electrode oxidation amount can be proportion of metal oxidation amount under a certain reference ashing condition to metal oxidation amount under conditions to be measured and, however, can be the measured oxide amount itself. The correlation between the metal oxidation amount and the capacitance value or the percentage of oxygen for nitrogen and the ashing time can be obtained.

Embodiment 2

The embodiment 2 is different from the embodiment 1 in annealing after lower electrode formation processed with the embodiment 1.

After removal of the photoresist 119 (step S7 in FIG. 3), a thermal process without plasma is carried out at not higher than 500° C. (step S9). For example, RTP (Rapid Thermal Processing) can take place in a nitrogen atmosphere for around several tens of seconds to five minutes. The upper limit of the thermal process temperature is determined by heat resistance in the silicide portion of a transistor.

Figure 11:
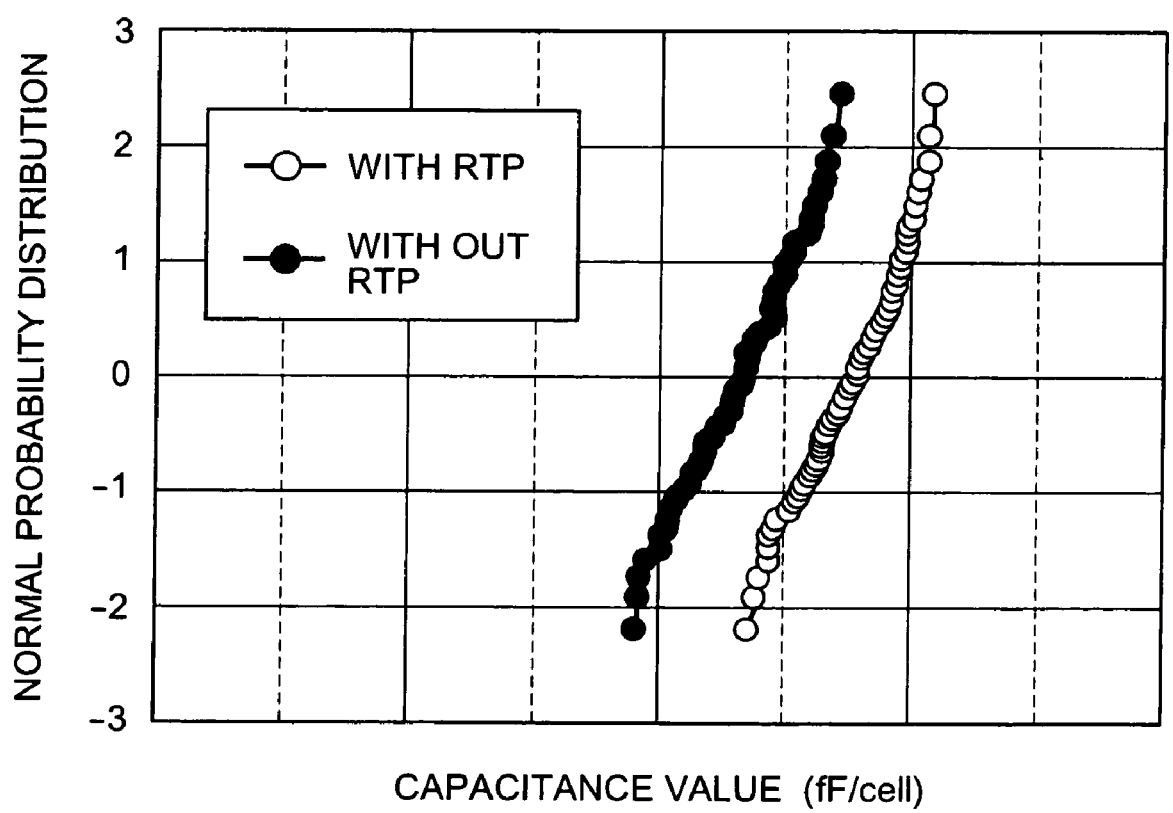
FIG. 11 is a graph comparing the capacitance value depending on presence of anneal after lower electrode formation.

The comparison of the capacitance values which are processed with or w/o RTP at 450° C. at 760 Torr for 30 seconds in N2 atmosphere is illustrated in the FIG. 11. Although there is no difference between the leakage currents of the capacitors processed with or w/o RTP, the capacitance values of the capacitor processed with RTP are 1fF/cell larger than the one processed w/o RTP. The reason hereof is considered that the apparent insulating layer thickness got thin, since the TiO layer on the TiN surface in the cylinder side wall portion was reformed to TiN by heat-treating in $N_2$ atmosphere. By applying annealing after lower electrode formation in addition to the ashing method in the embodiment 1, oxidation of the lower electrode is prevented. Thus the lower electrode being hardly apt to be oxidized is formed.

The embodiment hereof is applicable to any metal that can be easily oxidized by oxygen and is also applicable, for example, to tungsten nitride, titanium, tungsten, ruthenium and platinum. The configurations of the present invention were described above. Also, any combination of those configurations is effective as a mode of the present invention.

What is claimed is:

1. A method of fabricating a semiconductor device, said method comprising:
   forming a first metal film on a substrate;
   forming a photoresist film on the first metal film;
   forming a pattern in the photoresist film;
   processing the first metal film by dry etching with the pattern as a mask;
   ashing the photoresist without any bias at a predetermined temperature on the first metal film processed during the dry etching using a gas that comprises oxygen;
   forming a dielectric film on the first metal film subjected to ashing of the photoresist; and
   forming a second metal film on the dielectric film to form a metal-insulator-metal (MIM) capacitor,
   wherein a percentage of oxygen gas for the ashing is not more than a percentage of oxygen where an oxidation amount of the first metal layer is independent of a duration of said ashing.

2. The method of fabricating a semiconductor device according to claim 1, wherein the percentage of the oxygen gas is set to not less than a percentage that an ashing rate is 200 run/min or faster.

3. The method of fabricating a semiconductor device according to claim 1, wherein the first metal film comprises a metal nitride film.

4. The method of fabricating a semiconductor device according to claim 1, wherein the first metal film comprises titanium nitride.

5. The method of fabricating a semiconductor device according to claim 1, wherein the predetermined temperature is not lower than 25° C. and not higher than 40° C.

6. The method of fabricating a semiconductor device according to claim 1, wherein the predetermined temperature is 40° C. and the percentage of oxygen gas for the ashing is not less than 25% and not more than 50%.

7. The method of fabricating a semiconductor device according to claim 1, wherein the predetermined temperature is 25° C. and the percentage of oxygen gas for the ashing is not less than 50% and not more than 80%.

8. The method of fabricating a semiconductor device according to claim 1, wherein a thermal process is carried out between the ashing and the forming the dielectric film.

9. The method of fabricating a semiconductor device according to claim 8, wherein the thermal process is carried out at not higher than 500° C.

10. The method of fabricating a semiconductor device according to claim 8, wherein the thermal process is carried out in nitrogen.

11. The method of fabricating a semiconductor device according to claim 1, wherein a thermal process is carried out between the forming of the first metal film and the forming of the photoresist film.

12. The method of fabricating a semiconductor device according to claim 1, wherein a thermal process is carried out at least between one of the ashing and said forming of the dielectric film, and said forming of the first metal film and said forming of the photoresist film.

13. The method of fabricating a semiconductor device according to claim 1, wherein the etching further comprises applying argon as a diluents gas.

14. The method of fabricating a semiconductor device according to claim 1, further comprising:
  setting the percentage of oxygen gas for the ashing based on a shape of the first metal film and a required capacitance value of the MIM capacitor.

15. The method of fabricating a semiconductor device according to claim 1, further comprising:
  adjusting a temperature of the ashing to set the percentage of oxygen gas for the ashing based on the percentage of oxygen where the oxidation amount of the first metal layer is independent of the duration of said ashing.

16. A method of fabricating a semiconductor device, said method comprising:
  forming a first metal film on a substrate;
  forming a photoresist film on the first metal film;
  forming a pattern in the photoresist film;
  processing the first metal film by dry etching with the pattern as a mask;
  ashing the photoresist without any bias at a predetermined temperature on the first metal film processed during the dry etching;
  forming a dielectric film on the first metal film subjected to ashing of the photoresist; and
  forming a second metal film on the dielectric film to form a metal-insulator-metal (MIM) capacitor,
  wherein a percentage of oxygen gas for the ashing is not more than a percentage of oxygen where an oxidation amount of the first metal layer is independent of a duration of said ashing, and
  wherein a thermal process is carried out at least between one of the ashing and said forming the dielectric film, and said forming the first metal film and said forming the photoresist film.

17. The method of fabricating a semiconductor device according to claim 16, wherein said ashing the photoresist comprises applying a gas that comprises oxygen during the dry etching.

18. A method of fabricating a semiconductor device, said method comprising:
  forming a first metal film on a substrate;
  forming a photoresist film on the first metal film;
  forming a pattern in the photoresist film;
  processing the first metal film by dry etching with the pattern as a mask;
  ashing the photoresist without a bias at a predetermined temperature on the first metal film processed during the dry etching;
  forming a dielectric film on the first metal film subjected to ashing of the photoresist; and
  forming a second metal film on the dielectric film to form a metal-insulator-metal (MIM) capacitor,
  wherein a thermal process is carried out at least between one of the ashing and said forming the dielectric film, and said forming the first metal film and said forming the photoresist film.

19. The method of fabricating a semiconductor device according to claim 18, wherein a percentage of oxygen gas for the ashing is not more than a percentage of oxygen where an oxidation amount of the first metal layer is independent of a duration of said ashing.

20. The method of fabricating a semiconductor device according to claim 19, wherein said ashing the photoresist comprises applying a gas that comprises oxygen during the dry etching.

* * * * *